(12) United States Patent
Ogita (10) Patent No.: US 7,459,952 B2
(45) Date of Patent: Dec. 2, 2008

(54) CLOCK SIGNAL GENERATING DEVICE, GENERATING METHOD, AND SIGNAL PROCESSING DEVICE

(75) Inventor: Shinichi Ogita, Kyoto (JP)

(73) Assignee: Panasonic Corporation, Osaka (JP)

( * ) Notice: Subject to any disclaimer, the term of this patent is extended or adjusted under 35 U.S.C. 154(b) by 102 days.

(21) Appl. No.: 11/539,251

(22) Filed: Oct. 6, 2006

(65) Prior Publication Data

US 2007/0103221 A1 May 10, 2007

(30) Foreign Application Priority Data

Oct. 14, 2005 (JP) .............................. 2005-300050

(51) Int. Cl.
*H03H 11/16* (2006.01)
(52) U.S. Cl. ....................... 327/239; 327/296
(58) Field of Classification Search ................ None
See application file for complete search history.

(56) References Cited

U.S. PATENT DOCUMENTS 6,653,881 B2 * 11/2003 Truong et al. ............... 327/259
6,710,637 B1 * 3/2004 Chan .......................... 327/259
6,798,248 B2 * 9/2004 Hazucha et al. ............... 326/93
6,838,922 B2 * 1/2005 Melcher ..................... 327/291
2005/0018061 A1 1/2005 Choi

FOREIGN PATENT DOCUMENTS

JP 2005045786 2/2005

* cited by examiner

*Primary Examiner*—Cassandra Cox
(74) *Attorney, Agent, or Firm*—RatnerPrestia (57) ABSTRACT

When the operating speed of a switched capacitor circuit is accelerated, the timing of the clock signals regulating switched capacitor circuit operation can be disrupted by the effects of variation introduced by the manufacturing process as well as parasitic resistance and parasitic capacitance on signal traces. A control signal generating unit adjusts the timing of the bottom plate sampling period and non-overlapping period of the clock signals supplied to operate the switched capacitor circuit, thus avoiding disrupting the control signal timing and affording a switched capacitor circuit without increasing the area of the logic devices that set the bottom plate sampling period and non-overlapping period.

13 Claims, 8 Drawing Sheets

CLOCK SIGNAL GENERATING DEVICE, GENERATING METHOD, AND SIGNAL PROCESSING DEVICE

BACKGROUND OF THE INVENTION

1. Field of Invention

The present invention relates generally to technology for operating an operational amplifier using a switched capacitor circuit, and relates more particularly to technology for a clock signal generating device, generating method, and signal processing device for supplying clock signals to a switched capacitor circuit.

2. Description of Related Art

Switched capacitor circuits that provide high speed operation and occupy little space are needed for such applications as use in the amplifier stage of a pipeline A/D converter. As operating speed increases and device size decreases, the timing requirements of the clock signal used to operate the switched capacitor circuit become increasingly critical.

Figure 8:
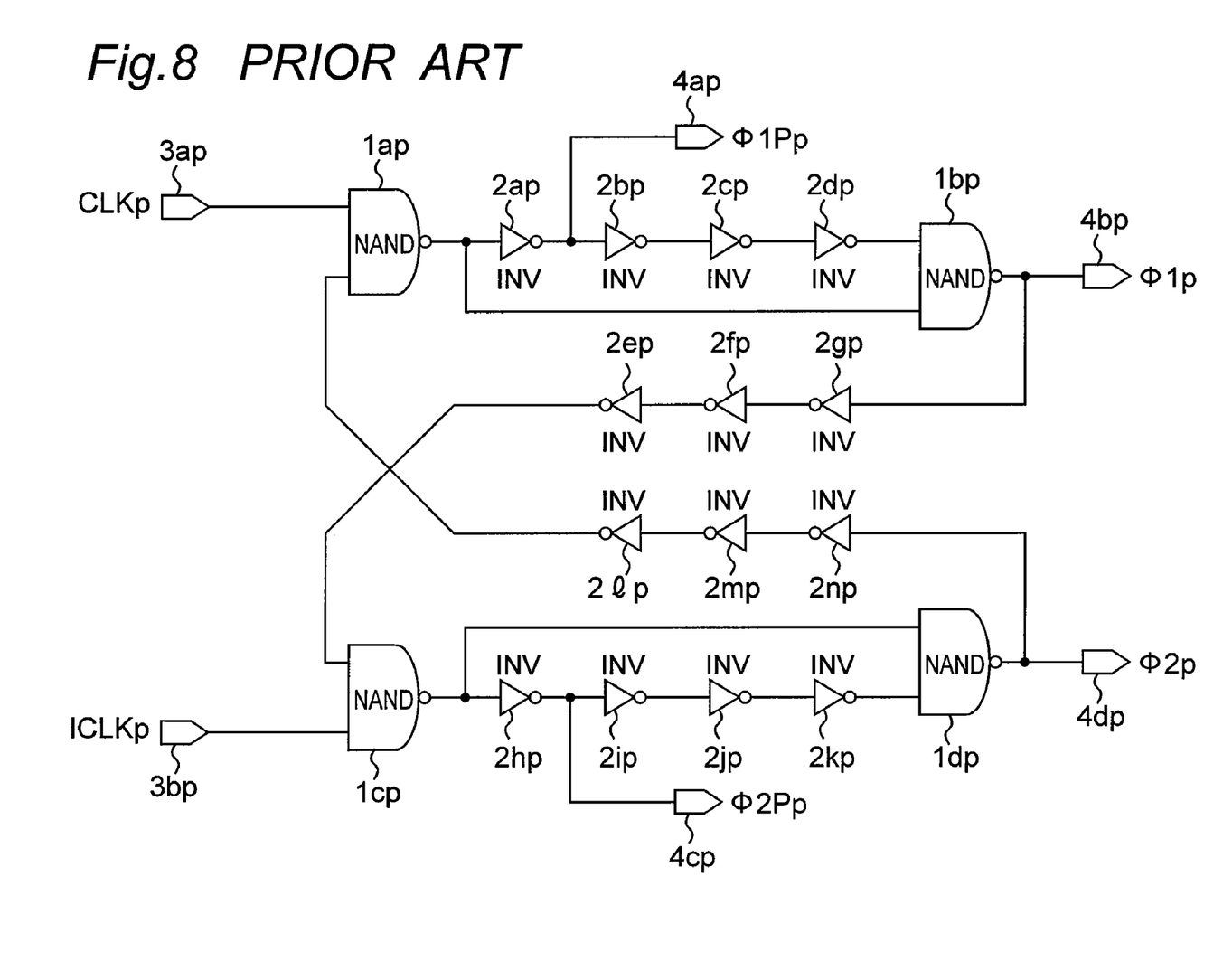
FIG. 8 is a circuit diagram of a clock signal generating circuit according to the related art.

FIG. 8 is a circuit diagram of a common clock signal generating circuit for generating the clock signals $\phi 1p$, $\phi 1Pp$, $\phi 2p$, $\phi 2Pp$ for operating an operational amplifier using a switched capacitor circuit. This clock signal generating circuit includes NAND circuits 1ap, 1bp, 1cp, 1dp, and a plurality of logic devices rendered by inverters 2ap, 2bp, 2cp, 2dp, 2ep, 2fp, 2gp, 2hp, 2ip, 2jp, 2kp, 2lp, 2mp, 2np.

Figure 9:
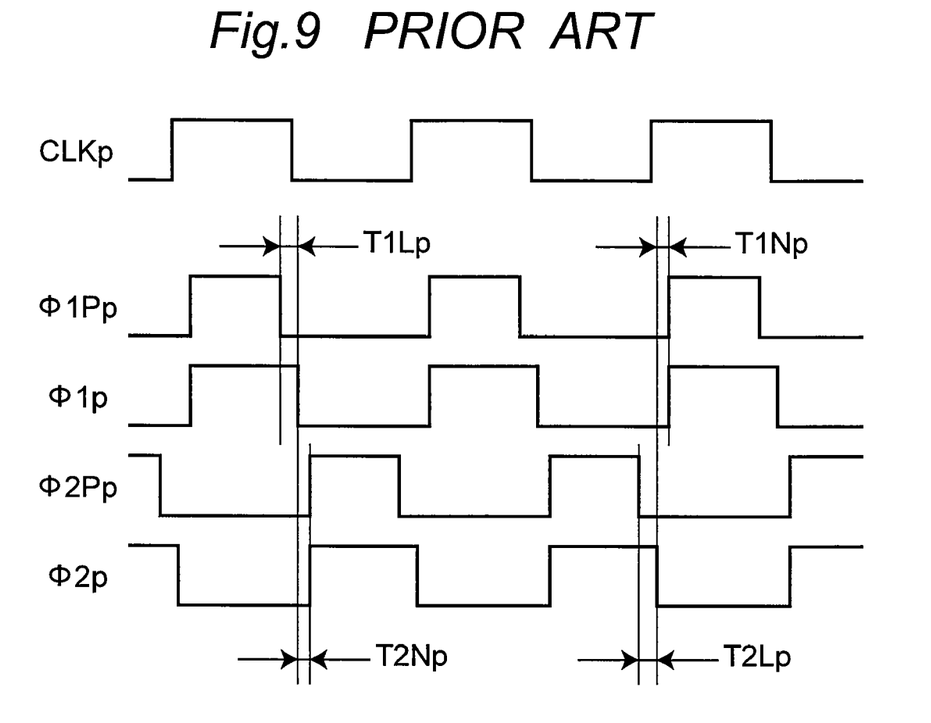
FIG. 9 is a timing chart of a clock signal generating circuit according to the related art.

FIG. 9 is a timing chart of clock signals $\phi 1p$, $\phi 1Pp$, $\phi 2p$, $\phi 2Pp$.

A bottom plate sampling period and a non-overlapping period are provided in a switched capacitor circuit to prevent the adverse effects of charge accumulation in the parasitic capacitance when the switch switches. An arrangement according to the related art for generating these periods is described next.

The timing of the bottom plate sampling period T1Lp required at the falling edge of clock signal $\phi 1Pp$ and the falling edge of clock signal $\phi 1p$ is determined by the total delay of logic devices 2bp, 2cp, 2dp.

The timing of the non-overlapping period T2Np required at the falling edge of clock signal $\phi 1p$ and the rising edge of clock signal $\phi 2p$ is determined by the total delay of logic devices 2ep, 2fp, 2gp.

Likewise, the timing of the bottom plate sampling period T2Lp required at the falling edge of clock signal $\phi 2Pp$ and the falling edge of clock signal $\phi 2p$ is determined by the total delay of logic devices 2ip, 2jp, 2kp.

The timing of the non-overlapping period T1Np required at the failing edge of clock signal $\phi 2p$ and the rising edge of clock signal $\phi 1p$ is determined by the total delay of logic devices 2lp, 2mp, 2np.

The clock signals CLKp and ICLKp input from input pins 3ap, 3bp are thus processed and output from output pins 4ap, 4bp, 4cp, 4dp at the timing of clock signals $\phi 1Pp$, $\phi 1p$, $\phi 2Pp$, $\phi 2p$, respectively.

Figure 10:
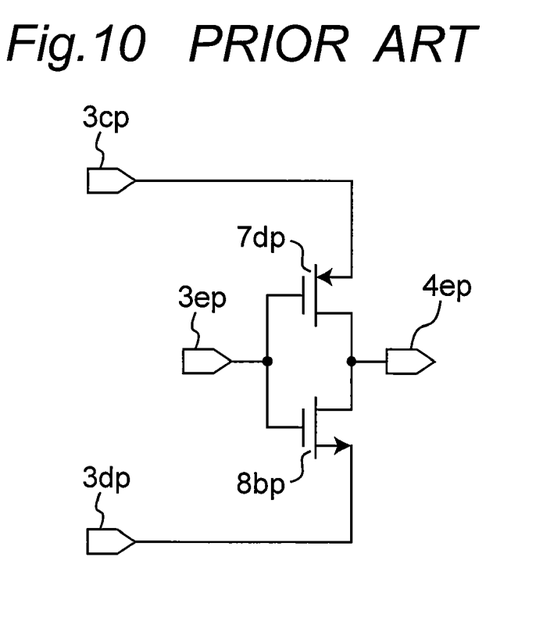
FIG. 10 is a circuit diagram of a logic device used in the clock signal generating circuit according to the related art.

The arrangement of the logic devices 2bp, 2cp, 2dp, 2ep, 2fp, 2gp, 2ip, 2jp, 2kp, 2lp, 2mp, 2np for setting the bottom plate sampling periods T1Lp and T2Lp and non-overlapping periods T1Np and T2Np is shown in FIG. 10. This is a common inverter circuit, and the transistors 7dp, 8bp rendering the inverter pass operating current between power supply node 3cp and ground node 3dp, take a clock signal input to node 3ep and output a clock signal from node 4ep. If the transistors are large, more operating current passes through the circuit, the response rate is faster, and the delay per logic device is shorter. Conversely, if the transistors are small, less operating current passes the circuit, the response rate is slower, and the delay per logic device is longer. The required bottom plate sampling periods T1LP and T2Lp and non-overlapping periods T1Np and T2Np can therefore be set by adjusting the size of the transistors.

The circuit shown in FIG. 8 uses three logic devices each to set the timing between clock signal $\phi 1Pp$ and clock signal $\phi 1p$, the timing between clock signal $\phi 1p$ and $\phi 2p$, the timing between clock signal $\phi 2Pp$ and clock signal $\phi 2p$, and the timing between clock signal $\phi 2p$ and clock signal $\phi 1p$. The required bottom plate sampling periods T1Lp and T2Lp and non-overlapping periods T1Np and T2Np can also be set by increasing the number of stages of these three element logic devices.

See, for example, U.S. Patent Application Publication No. 2005/0018061 (corresponding to Japanese Unexamined Patent Application Publication No. 2005-45786).

When the switched capacitor circuit and the clock signal generating circuit such as shown in FIG. 8 are provided on the same circuit board, variation in the logic devices and the parasitic resistance and parasitic capacitance components on the clock traces result in variation in the bottom plate sampling period and non-overlapping period. When a switched capacitor circuit is accelerated, the clock period is shorter and the effect of such variations is extremely great. This disrupts the timing of the bottom plate sampling period and non-overlapping period, and causes a signal offset in the operation of the switched capacitor circuit.

Furthermore, when the required bottom plate sampling period and non-overlapping period are set by adjusting the transistor size or increasing the number of logic device stages, depending upon the length of the required bottom plate sampling period and non-overlapping period, the area occupied by the logic devices for setting the bottom plate sampling period and non-overlapping period on the circuit board increases and could require using a larger circuit board.

SUMMARY OF THE INVENTION

A clock signal generating device according to a first aspect of the invention for supplying four clock signals with a repeating first edge and second edge to a switched capacitor circuit has a common mode delayed clock signal generator operable to generate a common mode delayed clock signal having a first edge delayed a first variable discharge delay from the first edge of a common mode reference clock signal; an opposite phase delayed clock signal generator operable to generate an opposite phase delayed clock signal with a first edge delayed a second variable discharge delay from the first edge of an opposite phase reference clock signal; a common mode reference clock signal generator operable to generate a common mode reference clock signal having a second edge delayed a first variable non-superimposed delay from the first edge of the opposite phase delayed clock signal; and an opposite phase reference clock signal generator operable to generate the opposite phase reference clock signal having a second edge delayed a second variable non-superimposed delay from the first edge of the common mode delayed clock signal. The common mode delayed clock signal generator generates the common mode delayed clock signal with a second edge delayed substantially the first variable non-superimposed delay from the first edge of the opposite phase delayed clock signal, and the opposite phase delayed clock signal generator generates the opposite phase delayed clock signal with a second edge delayed substantially the second variable non-superimposed delay from the first edge of the common mode delayed clock signal.

A clock signal generating method according to another aspect of the invention for supplying four clock signals with a repeating first edge and second edge to a switched capacitor circuit has generating a common mode delayed clock signal having a first edge delayed a first variable discharge delay from the first edge of a common mode reference clock signal; generating an opposite phase delayed clock signal with a first edge delayed a second variable discharge delay from the first edge of an opposite phase reference clock signal; generating a common mode reference clock signal having a second edge delayed a first variable non-superimposed delay from the first edge of the opposite phase delayed clock signal; and generating the opposite phase reference clock signal having a second edge delayed a second variable non-superimposed delay from the first edge of the common mode delayed clock signal. The generating the common mode delayed clock signal generates the common mode delayed clock signal with a second edge delayed substantially the first variable non-superimposed delay from the first edge of the opposite phase delayed clock signal, and the generating the opposite phase delayed clock signal generates the opposite phase delayed clock signal with a second edge delayed substantially the second variable non-superimposed delay from the first edge of the common mode delayed clock signal.

A signal processing device according to another aspect of the invention has a switched capacitor circuit; a clock signal generating device operable to supply four clock signals with a repeating first edge and second edge to the switched capacitor circuit; and a control signal adjustment arrangement operable to adjust the first edge and second edge of the clock signals based on signals that are signal processed by the switched capacitor circuit. The clock signal generating device has a common mode delayed clock signal generator operable to generate a common mode delayed clock signal having a first edge delayed a first variable discharge delay from the first edge of a common mode reference clock signal; an opposite phase delayed clock signal generator operable to generate an opposite phase delayed clock signal having a first edge delayed a second variable discharge delay from the first edge of an opposite phase reference clock signal; a common mode reference clock signal generator operable to generate a common mode reference clock signal having a second edge delayed a first variable non-superimposed delay from the first edge of the opposite phase delayed clock signal; and an opposite phase reference clock signal generator operable to generate the opposite phase reference clock signal having a second edge delayed a second variable non-superimposed delay from the first edge of the common mode delayed clock signal. The common mode delayed clock signal generator generates the common mode delayed clock signal with a second edge delayed substantially the first variable non-superimposed delay from the first edge of the opposite phase delayed clock signal, and the opposite phase delayed clock signal generator generates the opposite phase delayed clock signal with a second edge delayed substantially the second variable non-superimposed delay from the first edge of the common mode delayed clock signal.

As described above, the invention enables precisely adjusting the timing of the bottom plate sampling period and non-overlapping period required in a switched capacitor circuit. Disruption of the timing of the bottom plate sampling period and non-overlapping period can thus be avoided when accelerating the switched capacitor circuit even if there is a parasitic resistance and parasitic capacitance on the signal traces or manufacturing variations in the operational amplifier using the switched capacitor circuit. The timing can also be adjusted precisely by adjusting the current flow to the logic devices that set the delay of the bottom plate sampling period and non-overlapping period. The required bottom plate sampling period and non-overlapping period can therefore be set without adjusting the transistor size or increasing the number of logic device stages. A small circuit board can therefore be used because the switched capacitor circuit can be rendered without increasing the area of the logic devices used to set the bottom plate sampling period and non-overlapping period delay.

Other objects and attainments together with a fuller understanding of the invention will become apparent and appreciated by referring to the following description and claims taken in conjunction with the accompanying drawings.

DETAILED DESCRIPTION OF THE PREFERRED EMBODIMENTS

Preferred embodiments of a motor drive device according to the present invention are described below with reference to the accompanying figures. The numbers used in the following description of the invention are used by way of example only to describe the invention in detail, and the invention is not limited to these values.

First Embodiment

Figure 1:
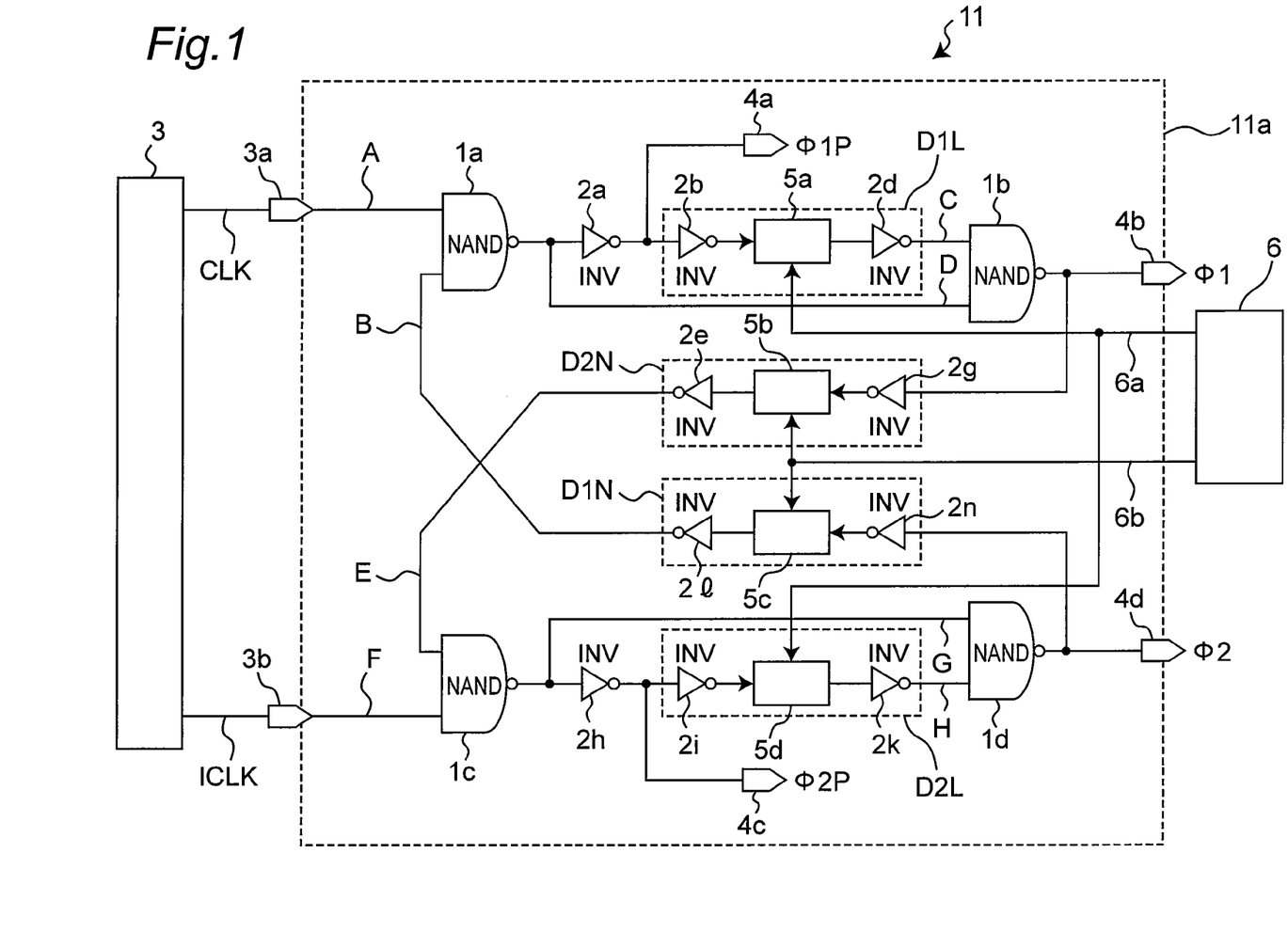
FIG. 1 is a circuit diagram of a clock signal generating device according to a first embodiment of the invention.

FIG. 1 is a circuit diagram showing the arrangement of a clock signal generating device 11 according to a first embodiment of the invention. The clock signal generating device 11 shown in FIG. 1 includes a clock signal output unit 3 for outputting clock signal CLK and clock signal ICLK, which is clock signal CLK inverted (opposite phase), a control signal generating unit 6 for generating control signals 6a and 6b, and clock signal generating circuit 11a.

The clock signal generating circuit 11a includes NAND circuits 1a, 1b, 1c, 1d, inverter circuits 2a, 2b, 2d, 2e, 2g, 2h, 2i, 2k, 2l, 2n, input pin 3a for inputting clock signal CLK, input pin 3b for inputting clock signal ICLK, output pin 4a for outputting clock signal φ1P, output pin 4b for outputting clock signal φ1, output pin 4c for outputting clock signal φ2P, output pin 4d for outputting clock signal φ2, and logic devices 5a, 5b, 5c with an inverter circuit function for varying the clock signal delay based on control signals 6a and control signal 6b.

Inverter circuits 2b and 2d and logic device 5a render variable discharge delay circuit D1L.

Inverter circuits 2l and 2n and logic device 5c render variable non-superimposed delay circuit D1N.

Inverter circuits 2i and 2k and logic device 5d render variable discharge delay circuit D2L.

Inverter circuits 2e and 2g and logic device 5b render variable non-superimposed delay circuit D2N.

Variable non-superimposed delay circuit D1N, NAND circuit 1a, and inverter circuit 2a render a common mode reference clock signal generating unit.

Variable non-superimposed delay circuit D2N, NAND circuit 1c, and inverter circuit 2h render an opposite phase reference clock signal generating unit.

The common mode reference clock signal generating unit, variable discharge delay circuit D1L, and NAND circuit 1b render a common mode delayed clock signal generating unit.

The opposite phase reference clock signal generating unit, variable discharge delay circuit D2L, and NAND circuit 1d render an opposite phase delayed clock signal generating unit.

The clock signal CLK is also called a common mode clock signal, and clock signal ICLK is also called an opposite phase clock signal.

Clock signal φ1P is also called a common mode reference clock signal and clock signal φ2P is also called an opposite phase reference clock signal.

Clock signal φ1 is also called a common mode delayed clock signal, and clock signal φ2 is also called an opposite phase delayed clock signal.

Control signal 6a is also called a discharge control signal, and control signal 6b is also called a non-superimposed control signal.

Based on common mode clock signal CLK and opposite phase clock signal ICLK, the clock signal generating device 11 generates common mode reference clock signal φ1P and opposite phase delayed clock signal φ1 that are the same phase and delayed to the common mode clock signal CLK, and generates opposite phase reference clock signal φ2P and opposite phase delayed clock signal φ2 that are the same phase and delayed to opposite phase clock signal ICLK. The delay of common mode reference clock signal φ1P and common mode delayed clock signal φ1 to common mode clock signal CLK, and the delay of opposite phase reference clock signal φ2P and opposite phase delayed clock signal φ2 to opposite phase clock signal ICLK are less than half the clock signal CLK, ICLK period.

The common mode reference clock signal generating unit generates the common mode reference clock signal φ1P based on common mode clock signal CLK and opposite phase delayed clock signal φ2.

The opposite phase reference clock signal generating unit generates the opposite phase reference clock signal φ2P based on the opposite phase clock signal ICLK and the common mode delayed clock signal φ1.

The common mode delayed clock signal generating unit generates the common mode delayed clock signal φ1 that is related to the common mode reference clock signal φ1P based on the common mode clock signal CLK and opposite phase delayed clock signal φ2.

The opposite phase delayed clock signal generating unit generates the opposite phase delayed clock signal φ2 related to the opposite phase reference clock signal φ2P based on the opposite phase clock signal ICLK and the common mode delayed clock signal φ1.

Figure 2:
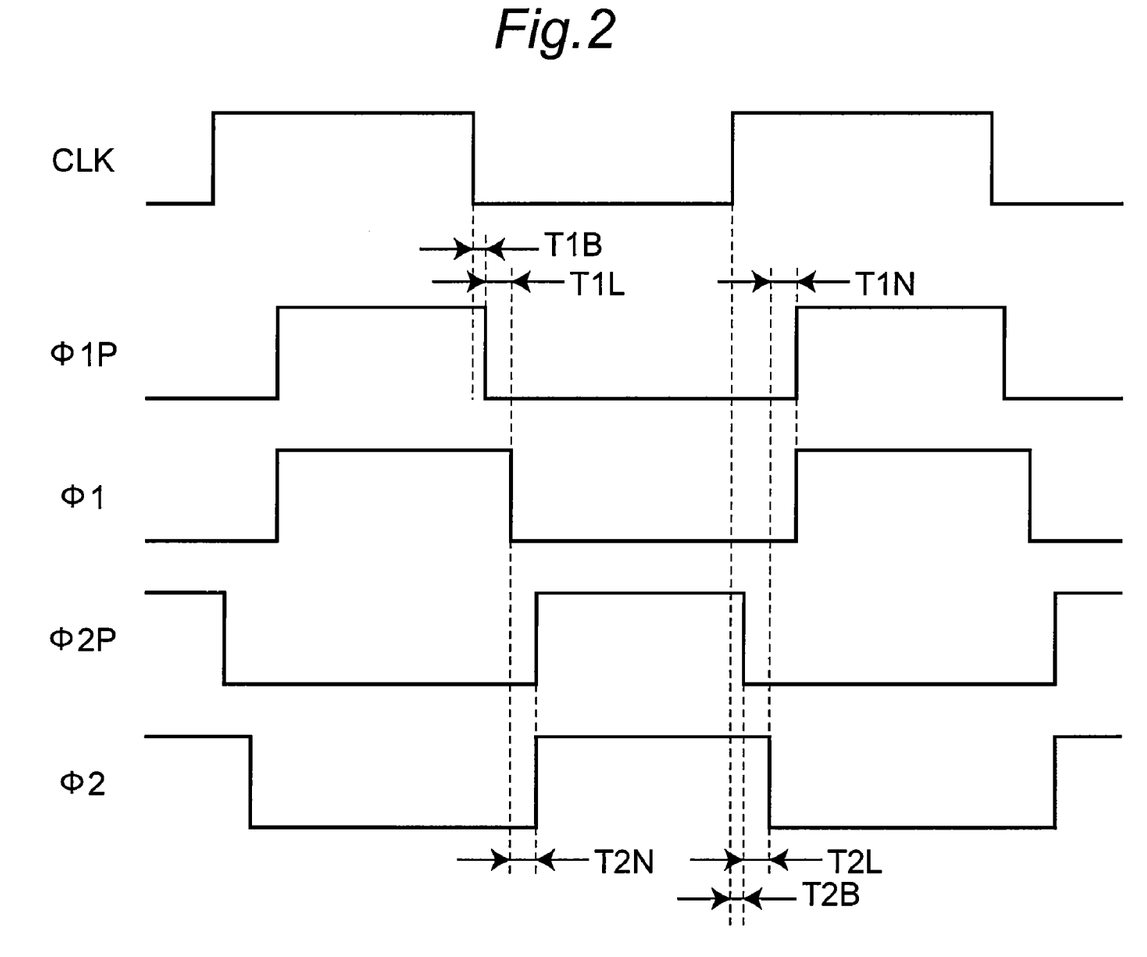
FIG. 2 is a timing chart describing operation of the clock signal generating device of the first embodiment of the invention.

FIG. 2 is a timing chart describing the operation of the clock signal generating device 11 according to this first embodiment of the invention.

Operation of the clock signal generating device 11 is described next with reference to FIG. 1 and FIG. 2.

The clock signal generating device 11 generates four clock signals φ1P, φ1, φ2P, and φ2 with repeating falling edges and rising edges. Clock signal B is opposite phase (i.e., same phase as the clock signal CLK) and delayed to clock signal φ2. Clock signal φ1P is derived from clock signal A (clock signal CLK) and clock signal B where φ1P=A*B.

Because clock signal A is HIGH at the rising edge of clock signal B, φ1P=1 (HIGH), and at the falling edge of clock signal A (more precisely, after the combined delay T1B of NAND 1a and inverter 2a), φ1P=0 (goes LOW). Clock signal B at this time is the clock signal φ2 inverted and delayed. The total of this delay and delay T1B is also called the variable non-superimposed delay T1N, and can be adjusted by the logic device 5c according to control signal 6b. More specifically, the rising edge of clock signal φ1P is delayed variable non-superimposed delay T1N from the falling edge of clock signal φ2.

Clock signal φ1 is likewise derived from clock signal C and clock signal D and is the inverse of φ1=C*D, and at the falling edge of clock signal D, which precedes clock signal C, φ1=1. The rising edge of clock signal φ1 is therefore delayed approximately variable non-superimposed delay T1N from the rising edge of clock signal φ2. At the rising edge of clock signal C, which is delayed more than clock signal D, φ1=0. Clock signal C at this time is the delayed inverted clock signal φ1P. This delay T1L is also called the variable discharge delay T1L, and can be adjusted by the logic device 5a according to control signal 6a. More specifically, the falling edge of clock signal φ1 is delayed variable discharge delay T1L from the falling edge of clock signal φ1P.

Clock signal φ2P is derived from clock signal E and clock signal F (clock signal ICLK), and φ2P=E*F. At the rising edge of clock signal E, φ2P=1, and at the falling edge of clock signal F (more precisely after the combined delay T2B of NAND 1c and inverter 2h) φ2P=0. Clock signal E is the clock signal φ1 inverted and delayed. The total of this delay and delay T2B is also called variable non-superimposed delay T2N, and can be adjusted by the logic device 5b according to control signal 6b. More specifically, the rising edge of clock signal φ2P is delayed variable non-superimposed delay T2N from the rising edge of clock signal φ1.

Clock signal φ2 is likewise derived from clock signal G and clock signal H and is the inverse of φ1=G*H, and at the falling edge of clock signal G φ2=1. The rising edge of clock signal φ2 is therefore delayed approximately variable non-superimposed delay T2N from the falling edge of clock signal φ1. At the rising edge of clock signal H, φ2=0. Clock signal H at this time is the delayed inverted clock signal φ2P. This delay T2L is also called the variable discharge delay T2L, and can be adjusted by the logic device 5d according to control signal 6a. More specifically, the falling edge of clock signal φ2 is delayed variable discharge delay T2L from the falling edge of clock signal φ2P.

The period between the falling edge of clock signal φ2 and the rising edge of clock signal φ1P, that is, the non-overlapping period T1N of clock signal φ2 and clock signal φ1P, can be adjusted by the timing of control signal 6b.

The period between the falling edge of clock signal φ1P and the falling edge of clock signal φ1, that is, the bottom plate sampling period T1L of clock signal φ1P and clock signal φ1, can be adjusted by the timing of control signal 6a.

The period between the falling edge of clock signal φ1 and the rising edge of clock signal φ2P, that is, non-overlapping period T2N of clock signal φ1 and clock signal φ2P, can be adjusted by the timing of control signal 6b.

The period between the falling edge of clock signal φ2P and the falling edge of clock signal φ2, that is, the bottom plate sampling period T2L of clock signal φ2P and clock signal φ2, can be adjusted by the timing of control signal 6a.

The common mode delayed clock signal generating unit is controlled based on the discharge control signal 6a and adjusts variable discharge delay T1L.

The common mode reference clock signal generating unit is controlled based on non-superimposed control signal 6b and adjusts variable non-superimposed delay T1N.

The opposite phase delayed clock signal generating unit is controlled based on discharge control signal 6a and adjusts variable discharge delay T1L.

The opposite phase reference clock signal generating unit is controlled based on non-superimposed control signal 6b and adjusts variable non-superimposed delay T2N.

Figure 6:
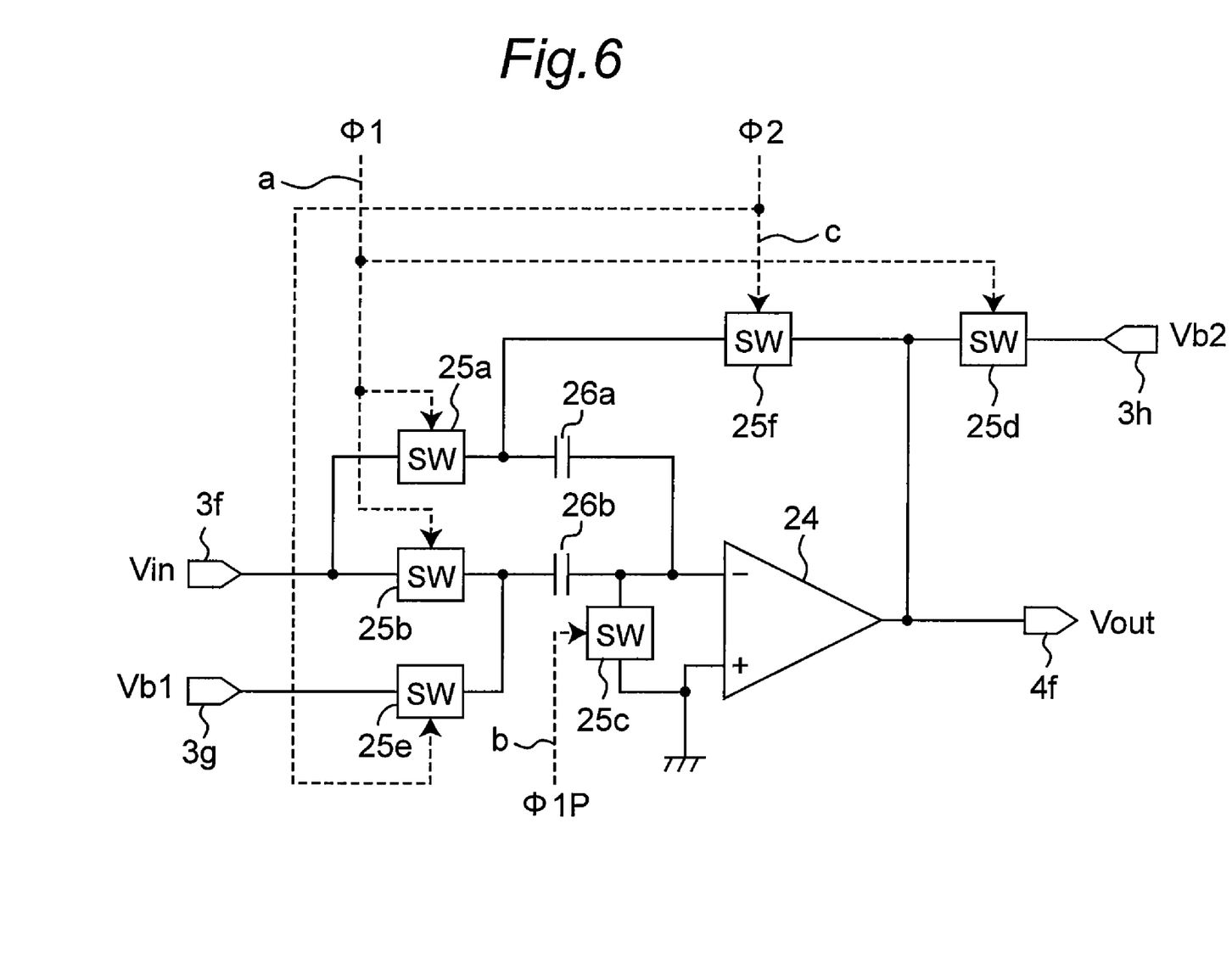
FIG. 6 is a block diagram showing a first example of a switched capacitor circuit that operates according to a clock signal from the clock signal generating device.

FIG. 6 shows an operational amplifier using a switched capacitor circuit operated by the clock signal generating device 11. An operational amplifier using a switched capacitor circuit is also called simply a switched capacitor circuit. This switched capacitor circuit is composed of switches 25a, 25b, 25d that switch on/off according to clock signal φ1 input over signal path a, switch 25c that switches on/off according to clock signal φ1P input over signal path b, switches 25e and 25f that switch on/off according to clock signal φ2 input over signal path c, capacitors 26a and 26b, and operational amplifier 24.

Signal Vin input from input pin 3f charges capacitors 26a and 26b when switches 25a, 25b go on when clock signal φ1 goes HIGH. Switch 25d also goes on when clock signal φ1 goes HIGH, and the bias voltage Vb2 input from input pin 3h resets the output signal Vout of operational amplifier 24. Switch 25c goes on when clock signal φ1P goes HIGH, and shorts the two inputs to operational amplifier 24. Switches 25e and 25f go off when clock signal φ2 goes LOW.

Switch 25c then goes off when clock signal φ1 goes LOW, and capacitors 26a and 26b proceed with bottom plate sampling. When the switch goes from on to off, the charge accumulated in the parasitic capacitance of the switch discharges (leaks). The leaked charge accumulates in the signal sampling capacitors and causes a signal offset. Bottom plate sampling is a method of preventing this signal offset. In a switched capacitor circuit this bottom plate sampling period T1L is extremely important.

When clock signal φ1 goes LOW, switches 25a, 25b, 25d turn off and capacitors 26a and 26b stop signal sampling. When clock signal φ2 goes HIGH, switches 25e and 25f turn on, capacitor 26b is shorted to bias voltage Vb1 from input pin 3g, and capacitor 26a is shorted to output signal Vout of operational amplifier 24. As a result, input signal Vin is amplified and the amplified output signal Vout is output from output pin 4f.

A time when all switches are off (non-overlapping period T2N) is required until switches 25a, 25b, 25d turn off when clock signal φ1 goes LOW and switches 25e and 25f turn on when clock signal φ2 goes HIGH.

This is because variation in the timing results in error in the amplified output signal Vout because clock signal φ2 goes on and the charge sampled by capacitors 26a and 26b is discharged before switches 25a, 25b, 25d are turned off by clock signal φ1. To prevent this, non-overlapping period T2N is important in a switched capacitor circuit.

If the capacitance of capacitors 26a and 26b is equal, this sequence of operations yields a switched capacitor circuit that produces output signal Vout based on signal Vin and bias voltage Vb1 where Vout=2*Vin −Vb1.

Figure 7:
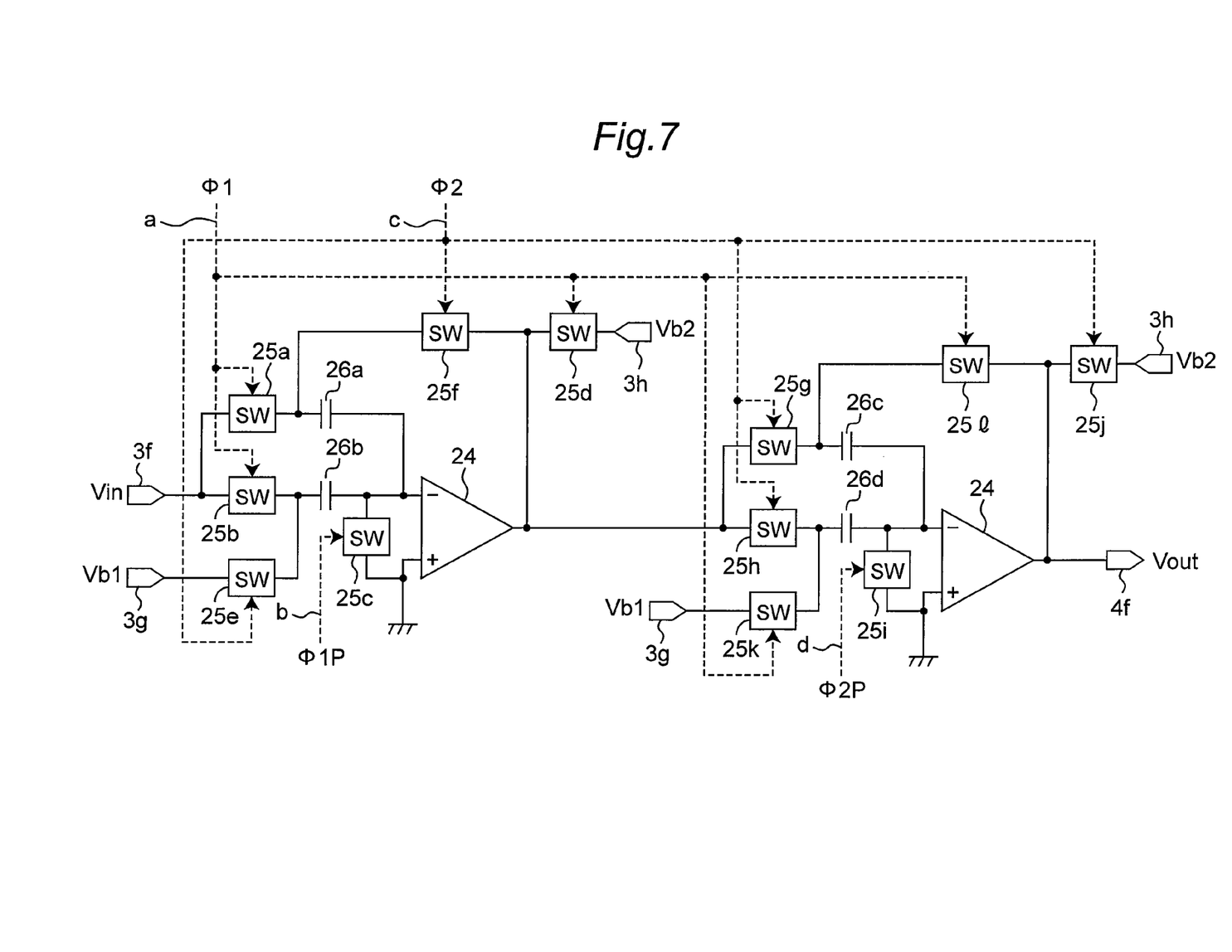
FIG. 7 is a block diagram showing a second example of a switched capacitor circuit that operates according to a clock signal from the clock signal generating device.

FIG. 7 shows a plurality of the switched capacitor circuits shown in FIG. 6 connected in series similarly to a pipeline A/D converter. These switched capacitor circuits operate in the same way based on clock signals φ1, φ1P, φ2, φ2P, and further description thereof is omitted.

The non-overlapping period and bottom plate sampling period can be adjusted as desired by driving the switched capacitor circuits shown in FIG. 6 and FIG. 7 by the clock signal generating device 11 according to this embodiment of the invention. Disruption of the timing of the bottom plate sampling period and non-overlapping period can thus be avoided when accelerating the switched capacitor circuit even if there is a parasitic resistance and parasitic capacitance on the signal traces or manufacturing variations in the switched capacitor circuit.

Only two control signals 6a and 6b are used in this embodiment as shown in FIG. 1, i.e. the control signals 6a and 6b are generated substantially at the same timing. But four different control signals can be generated so that a discrete control signal is separately applied to each of the logic devices 5a, 5b, 5c, 5d.

Furthermore, two variable discharge delays T1L and T2L are also defined, but variable discharge delay T1L and variable discharge delay T2L can be equal.

Furthermore, two variable non-superimposed delays T1N and T2N are also defined, but variable non-superimposed delay T1N and variable non-superimposed delay T2N can be equal.

Furthermore, the above description of the falling edge and rising edge times is reversed if switches 25a, 25b, 25c, 25d, 25e, and 25f turn on when the clock signals φ1, φ1P, φ2, φ2P go LOW.

Second Embodiment

A second embodiment of the invention is described below focusing on the differences between the second embodiment and the first embodiment. Other aspects of the arrangement, operation, and effect of this embodiment are the same as in the first embodiment, and further description thereof is omitted below.

The logic device 5a that receives the control signal and adjusts the delay in this second embodiment of the invention is described with reference to FIG. 3. This logic device 5a includes p-MOS transistors 7a, 7b, 7c, 7d, n-MOS transistors 8a, 8b, 8c, and variable current source 9 that adjusts the current supply based on control signal 6c.

MOS transistors 7d and 8b operate based on the clock signal input from input pin 3e. The operating current of transistors 7d and 8b is controlled by the variable current source 9 at this time because transistor 7a and transistors 7b and 7c, or transistor 8a and transistor 8c are in a current mirror configuration. Because the variable current source 9 is controlled by control signal 6c, the delay of the output clock signal from clock output pin 4e varies according to control signal 6a.

Figure 3:
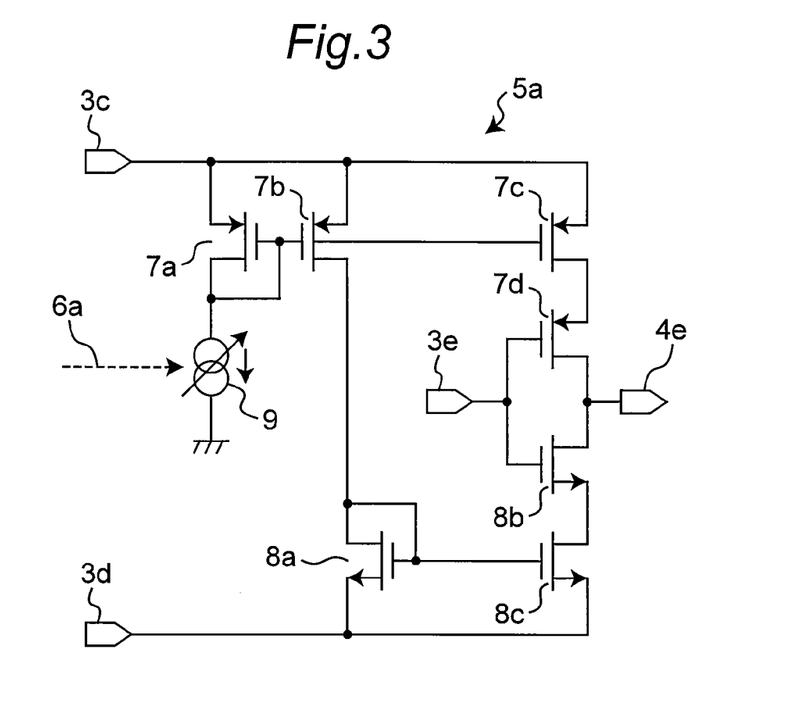
FIG. 3 is a circuit diagram showing the arrangement of logic devices according to a second embodiment of the invention.

Logic devices 5b, 5c, 5d are configured identically to logic device 5a as shown in FIG. 3, and the delay of logic devices 5b, 5c, 5d is controlled by control signals 6a, 6b, and 6a, respectively. Logic device 5a, 5b, 5c, 5d are also called active circuits. Active circuits 5a, 5b, 5c, 5d are included in the common mode delayed clock signal generating unit, common mode reference clock signal generating unit, the opposite phase reference clock signal generating unit, and the opposite phase delayed clock signal generating unit, respectively.

More specifically, the common mode delayed clock signal generating unit includes active circuit 5a that changes the variable discharge delay T1L by changing the operating current based on discharge control signal 6a.

The common mode reference clock signal generating unit includes active circuit 5c that changes the variable non-superimposed delay T1N by changing the operating current based on non-superimposed control signal 6b.

The opposite phase reference clock signal generating unit includes active circuit 5d that changes the variable discharge delay T2L by changing the operating current based on discharge control signal 6a.

The opposite phase delayed clock signal generating unit includes active circuit 5b that changes the variable non-superimposed delay T2N by changing the operating current based on non-superimposed control signal 6b.

If the arrangement of these logic devices 5a, 5b, 5c, 5d is applied to the clock signal generating device 11 (FIG. 1) described in the first embodiment, the timing of non-overlapping period T1N of clock signal φ2 and clock signal φ1P can be adjusted by control signal 6b, the timing of bottom plate sampling period T1L of clock signal φ1P and clock signal φ1 can be adjusted by control signal 6a, the timing of non-overlapping period T2N of clock signal φ1 and clock signal φ2P can be adjusted by control signal 6b, and the timing of bottom plate sampling period T2L of clock signal φ2P and clock signal φ2 can be adjusted by control signal 6a.

The non-overlapping period and bottom plate sampling period can thus be adjusted by supplying the clock signals generated by the clock signal generating device 11 using logic devices 5a, 5b, 5c, 5d according to this second embodiment of the invention to the switched capacitor circuit shown in FIG. 6 and FIG. 7. Disruption of the timing of the bottom plate sampling period and non-overlapping period can thus be avoided when accelerating the switched capacitor circuit even if there is a parasitic resistance and parasitic capacitance on the signal traces or manufacturing variations in the switched capacitor circuit. The timing can also be precisely adjusted by adjusting the current supply to the logic devices that set the bottom plate sampling period and non-overlapping period delay. More particularly, the required bottom plate sampling period and non-overlapping period can be desirably set without adjusting the transistor size or increasing the number of logic device stages. A small circuit board can therefore be used because the switched capacitor circuit can be rendered without increasing the area of the logic devices used to set the bottom plate sampling period and non-overlapping period delay.

Only two control signals 6a and 6b shown in FIG. 1 are used in this second embodiment of the invention, but four different control signals can be generated and applied separately to logic devices 5a, 5b, 5c, 5d.

Third Embodiment

A third embodiment of the invention is described below focusing on the differences between the third embodiment and the first and second embodiments. Other aspects of the arrangement, operation, and effect of this embodiment are the same as in the first and second embodiments, and further description thereof is omitted below.

Figure 4:
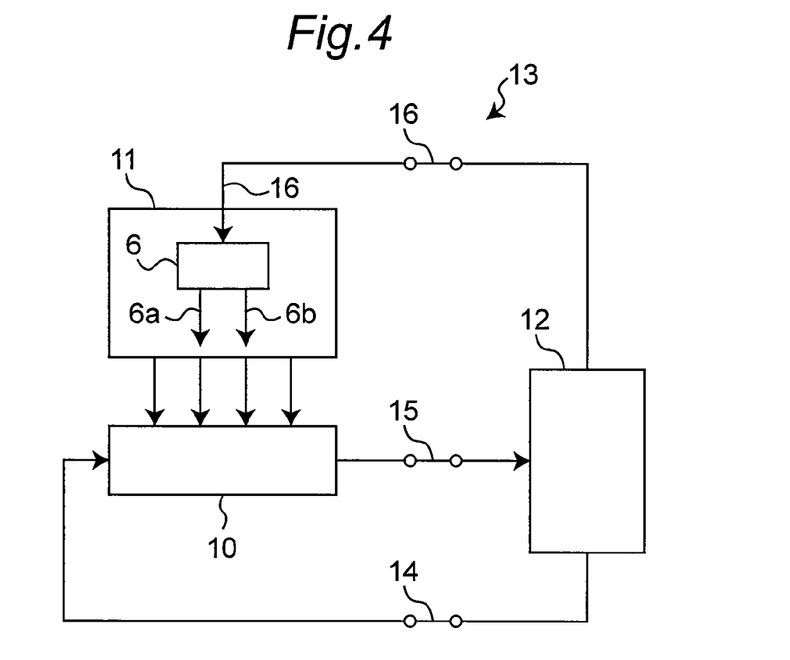
FIG. 4 is a block diagram of a signal generating device using a clock signal generating device according to a third embodiment of the invention.

FIG. 4 shows the arrangement of a signal processing device 13 using a clock signal generating device according to this third embodiment of the invention. As shown in FIG. 4 the signal processing device 13 includes a clock signal generating device 11, a switched capacitor circuit 10 such as described in FIG. 6 and FIG. 7, and an internal system 12 that operates independently of the switched capacitor circuit 10 and clock signal generating device 11. This internal system 12 is also called a control signal adjustment unit.

The operation of the signal processing device 13 according to this third embodiment of the invention is described next.

The internal system 12 first applies an analog input signal 14 to the switched capacitor circuit 10. The switched capacitor circuit 10 operates based on the clock signals φ1, φ1p, φ2, φ2P received from the clock signal generating device 11, signal processes the applied analog input signal 14, and outputs output signal 15.

The internal system 12 determines if the lengths of the bottom plate sampling period and non-overlapping period are appropriate based on the waveform of the output signal 15. More specifically, the internal system 12 determines if an excessive offset is imposed on the signal waveform because the periods are short, or if the periods are too long. As a result, the internal system 12 outputs a period adjustment signal 16 containing information for adjusting the periods to a more appropriate length to the control signal generating unit 6 of the clock signal generating device 11. Based on this period adjustment signal 16, the control signal generating unit 6 supplies the control signals 6a and 6b.

The signal processing device 13 can therefore set the timing that minimizes the offset created by a disruption in the timing of the bottom plate sampling period and non-overlapping period. As a result, disruption of the timing of the bottom plate sampling period and non-overlapping period can thus be avoided when accelerating the switched capacitor circuit even if there is a parasitic resistance and parasitic capacitance on the signal traces or manufacturing variations in the operational amplifier using the switched capacitor circuit.

Fourth Embodiment

A fourth embodiment of the invention is described below focusing on the differences between the fourth embodiment and the first embodiment. Other aspects of the arrangement, operation, and effect of this embodiment are the same as in the first embodiment, and further description thereof is omitted below.

Figure 5:
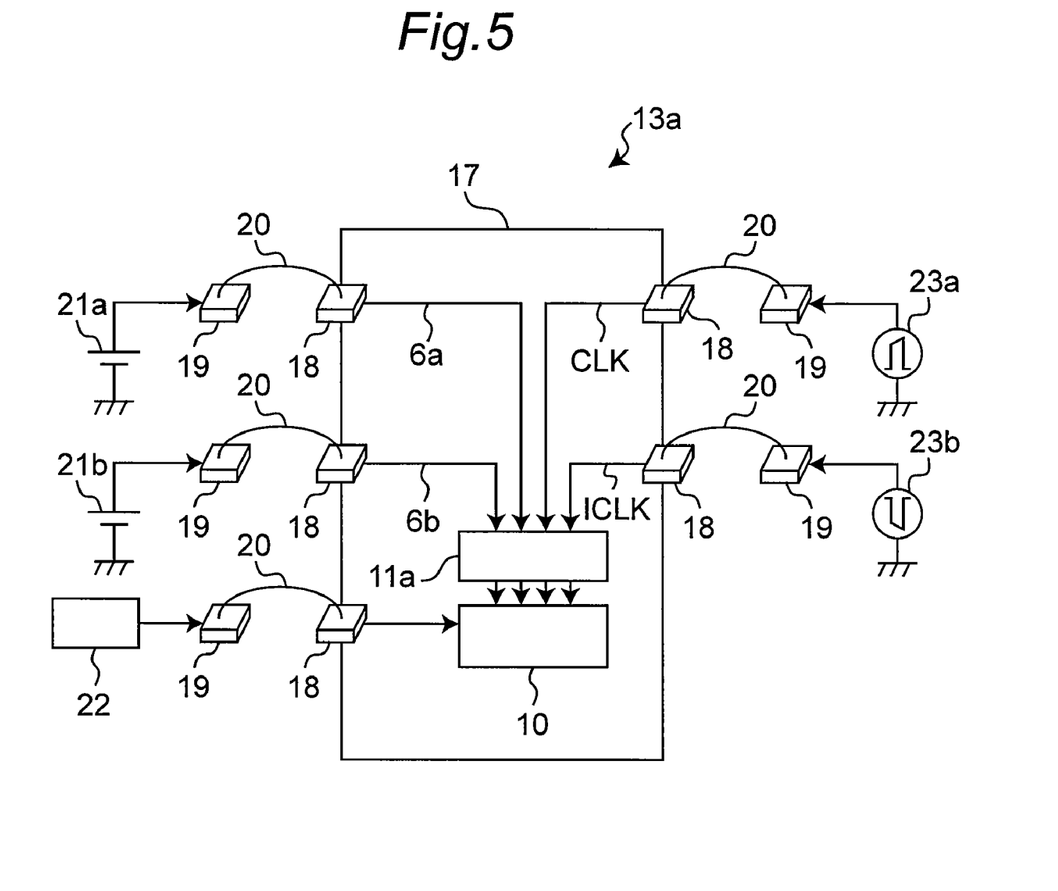
FIG. 5 is a block diagram of a signal generating device using a clock signal generating device according to a fourth embodiment of the invention.

FIG. 5 shows the arrangement of a signal processing device 13a using a clock signal generating device according to this fourth embodiment of the invention. As shown in FIG. 5 the signal processing device 13a includes a clock signal generating circuit 11a, a switched capacitor circuit 10, an external system 17 that includes the switched capacitor circuit 10 and clock signal generating circuit 11a, an internal wiring pad 18 for connecting the switched capacitor circuit 10 and clock signal generating circuit 11a by wire, external wiring pad 19, wire 20 connecting the external wiring pad 19 and internal wiring pad 18, external analog signal source 22, bias voltage sources 21a and 21b, and clock signal sources 23a and 23b.

An analog input signal from the external analog signal source 22 is input to the switched capacitor circuit 10 through the external wiring pad 19, wire 20, and internal wiring pad 18. Control signals 6a and 6b for controlling the logic device 5a, 5b, 5c, 5d in the clock signal generating circuit 11a and adjusting the bottom plate sampling period and non-overlapping period timing are input from bias voltage sources 21a and 21b, respectively. Clock signals CLK and ICLK for operating the clock signal generating circuit 11a are applied by clock signal sources 23a and 23b, respectively.

The bias voltage source 21a is also called a discharge voltage source, and bias voltage source 21b is also called a non-superimposed voltage source.

More specifically, the control signal generating unit 6 includes discharge voltage source 21a for generating and supplying discharge control signal 6a over a trace to the common mode delayed clock signal generating unit, a non-superimposed voltage source 21b for generating and supplying non-superimposed control signal 6b over a trace to the common mode reference clock signal generating unit, a discharge voltage source 21a for generating and supplying discharge control signal 6a over a trace to the opposite phase delayed clock signal generating unit, and a non-superimposed voltage source 21b for generating and supplying non-superimposed control signal 6b to the opposite phase reference clock signal generating unit.

If the timing of the bottom plate sampling period and non-overlapping period of the clock signal generating circuit 11a is set in the manufacturing process, the required timing characteristic of the clock signal generating circuit 11a can be fixed by connecting specific bias voltage sources 21a and 21b by wire 20 as shown in this fourth embodiment. The bottom plate sampling period and non-overlapping period timing that is best for the switched capacitor circuit 10 can therefore be achieved.

As described above, disruption of the timing of the bottom plate sampling period and non-overlapping period can thus be avoided when accelerating the switched capacitor circuit even if there is a parasitic resistance and parasitic capacitance on the signal traces or manufacturing variations in the operational amplifier using the switched capacitor circuit. The required bottom plate sampling period and non-overlapping period can also be set without adjusting the transistor size or increasing the number of logic device stages. A small circuit board can therefore be used because the switched capacitor circuit can be rendered without increasing the area of the logic devices used to set the bottom plate sampling period and non-overlapping period delay.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A clock signal generating device operable to supply four clock signals with a repeating first edge and second edge to a switched capacitor circuit, comprising:
    a common mode delayed clock signal generator operable to generate a common mode delayed clock signal having a first edge delayed a first variable discharge delay from the first edge of a common mode reference clock signal;
    an opposite phase delayed clock signal generator operable to generate an opposite phase delayed clock signal having a first edge delayed a second variable discharge delay from the first edge of an opposite phase reference clock signal;
    a common mode reference clock signal generator operable to generate a common mode reference clock signal having a second edge delayed a first variable non-superimposed delay from the first edge of the opposite phase delayed clock signal;
    an opposite phase reference clock signal generator operable to generate the opposite phase reference clock signal having a second edge delayed a second variable non-superimposed delay from the first edge of the common mode delayed clock signal; and
    a control signal generator operable to generate a first discharge control signal for controlling said common mode delayed clock signal generator and to change the first variable discharge delay, a first non-superimposed control signal for controlling said common mode reference clock signal generator and to chance the first variable non-superimposed delay, a second discharge control signal for controlling said opposite phase delayed clock signal generator and to change the second variable discharge delay, and a second non-superimposed control signal for controlling said opposite phase reference clock signal generator and to change the second variable non-superimposed delay;
    wherein said common mode delayed clock signal generator generates the common mode delayed clock signal with a second edge delayed substantially the first variable non-superimposed delay from the first edge of the opposite phase delayed clock signal, and
        said opposite phase delayed clock signal generator generates the opposite phase delayed clock signal with a second edge delayed substantially the second variable non-superimposed delay from the first edge of the common mode delayed clock signal.

2. The clock signal generating device described in claim 1, wherein the first variable discharge delay and second variable discharge delay are equal.

3. The clock signal generating device described in claim 1, wherein the first variable non-superimposed delay and second variable non-superimposed delay are equal.

4. The clock signal generating device described in claim 1, wherein said control signal generator generates the first discharge control signal and second discharge control signal substantially at the same timing.

5. The clock signal generating device described in claim 1, wherein said control signal generator generates the first non-superimposed control signal and second non-superimposed control signal substantially at the same timing.

6. The clock signal generating device described in claim 1, wherein:
    said common mode delayed clock signal generator includes an active circuit operable to change the first variable discharge delay by changing the operating current based on the first discharge control signal;
    said common mode reference clock signal generator includes an active circuit to change the first variable non-superimposed delay by changing the operating current based on the first non-superimposed control signal;
    said opposite phase delayed clock signal generator includes an active circuit operable to change the second variable discharge delay by changing the operating current based on the second discharge control signal; and
    said opposite phase reference clock signal generator includes an active circuit operable to change the second variable non-superimposed delay by changing the operating current based on the second non-superimposed control signal.

7. The clock signal generating device described in claim 1, wherein said control signal generator comprises:
    a first discharge voltage source operable to generate and to supply the first discharge control signal through a trace to said common mode delayed clock signal generator;
    a first non-superimposed voltage source operable to generate and to supply the first non-superimposed control signal through a trace to said common mode reference clock signal generator;

a second discharge voltage source operable to generate and to supply the second discharge control signal through a trace to said opposite phase delayed clock signal generator; and a second non-superimposed voltage source operable to generate and to supply the second non-superimposed control signal through a trace to said opposite phase reference clock signal generator.

8. A clock signal generating method for supplying four clock signals with a repeating first edge and second edge to a switched capacitor circuit, comprising:

generating a common mode delayed clock signal having a first edge delayed a first variable discharge delay from the first edge of a common mode reference clock signal;

generating an opposite phase delayed clock signal having a first edge delayed a second variable discharge delay from the first edge of an opposite phase reference clock signal;

generating a common mode reference clock signal having a second edge delayed a first variable non-superimposed delay from the first edge of the opposite phase delayed clock signal; and generating the opposite phase reference clock signal having a second edge delayed a second variable non-superimposed delay from the first edge of the common mode delayed clock signal; and generating a first discharge control signal for changing the first variable discharge delay, a first non-superimposed control signal for changing the first variable non-superimposed delay, a second discharge control signal for changing the second variable discharge delay, and a second non-superimposed control signal for changing the second variable non-superimposed delay;

wherein said generating the common mode delayed clock signal generates the common mode delayed clock signal with a second edge delayed substantially the first variable non-superimposed delay from the first edge of the opposite phase delayed clock signal, and said generating the opposite phase delayed clock signal generates the opposite phase delayed clock signal with a second edge delayed substantially the second variable non-superimposed delay from the first edge of the common mode delayed clock signal.

9. The clock signal generating method described in claim 8, wherein the first variable discharge delay and second variable discharge delay are equal.

10. The clock signal generating method described in claim 8, wherein the first variable non-superimposed delay and second variable non-superimposed delay are equal.

11. The clock signal generating method described in claim 8, wherein said generating the control signal generates the first discharge control signal and second discharge control signal substantially at the same timing.

12. The clock signal generating method described in claim 8, wherein said generating the control signal generates the first non-superimposed control signal and second non-superimposed control signal substantially at the same timing.

13. The clock signal generating method described in claim 8, wherein:

said generating the common mode delayed clock signal includes changing the first variable discharge delay by changing the operating current based on the first discharge control signal;

said generating the common mode reference clock signal includes changing the first variable non-superimposed delay by changing the operating current based on the first non-superimposed control signal;

said generating the opposite phase delayed clock signal includes changing the second variable discharge delay by changing the operating current based on the second discharge control signal; and said generating the opposite phase reference clock signal includes changing the second variable non-superimposed delay by changing the operating current based on the second non-superimposed control signal.

* * * * *